(12) United States Patent
Xu et al.

(10) Patent No.: US 6,768,177 B1
(45) Date of Patent: Jul. 27, 2004

(54) PARALLEL PLATE DIODE

(75) Inventors: Yelin Xu, Beijing (CN); Ling Jiang, Beijing (CN); Qiang Xu, Beijing (CN)

(73) Assignee: Institute of Biophysics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 10/049,486

(22) PCT Filed: Mar. 29, 2000

(86) PCT No.: PCT/CN00/00068

§ 371 (c)(1),
(2), (4) Date: Feb. 28, 2002

(87) PCT Pub. No.: WO01/17027

PCT Pub. Date: Mar. 8, 2001

(30) Foreign Application Priority Data

Aug. 30, 1999 (CN) .......................... 99118929 A

(51) Int. Cl.[7] ............................................. H01L 29/76
(52) U.S. Cl. ...................................... 257/367; 257/109
(58) Field of Search ............................ 257/44, 46, 45, 257/109, 288, 367, 577, 604, 624, 625, 471; 438/328

(56) References Cited

U.S. PATENT DOCUMENTS 3,987,305 A    10/1976  Gilbert ....................... 250/374
4,947,104 A    8/1990   Pyke .......................... 324/71.5
4,990,988 A *  2/1991   Lin ............................. 257/215
5,365,102 A *  11/1994  Mehrotra et al. ........... 257/475
6,501,145 B1 * 12/2002  Kaminski et al. ........... 257/471

FOREIGN PATENT DOCUMENTS

EP          0506450         9/1992

* cited by examiner

Primary Examiner—Eddie Lee
Assistant Examiner—Douglas W. Owens
(74) Attorney, Agent, or Firm—JDI Patent; Joshua D. Isenberg

(57) ABSTRACT

A parallel plate diode comprising metal electrodes and semiconductor materials layer contacting said metal electrodes. Two thin plate electrodes made of metal are disposed in parallel, and there is a layer of thin plate semiconductor material sandwiched between the two thin plate electrodes, the concentration of the carriers in the semiconductor material layer is 20% or less than that of the electrons in the metal. One of the metal electrodes is made so as to have a plurality of recesses from its surface into the interior on the side that faces the semiconductor coat layer, the diameter of those recesses is less than 4 micrometers. These recesses are well-shape cavities and an array of the convex portions and concave portions are staggered each other. The cross section of the well shape is circular, square or rectangle. This diode output a current and a voltage in a closed loop circuit without bias voltage or bias current.

11 Claims, 6 Drawing Sheets

(a)

(b)

(c)

(d)

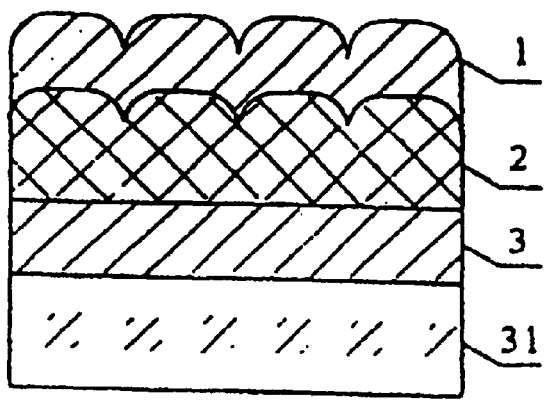
(a)
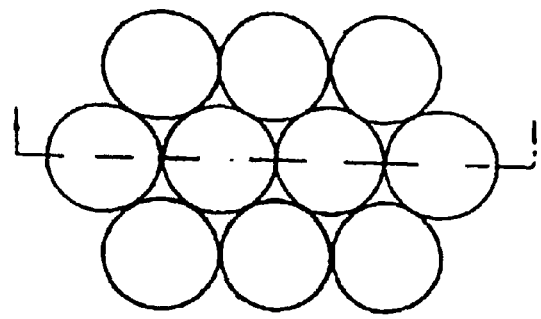
(b) Fig.7
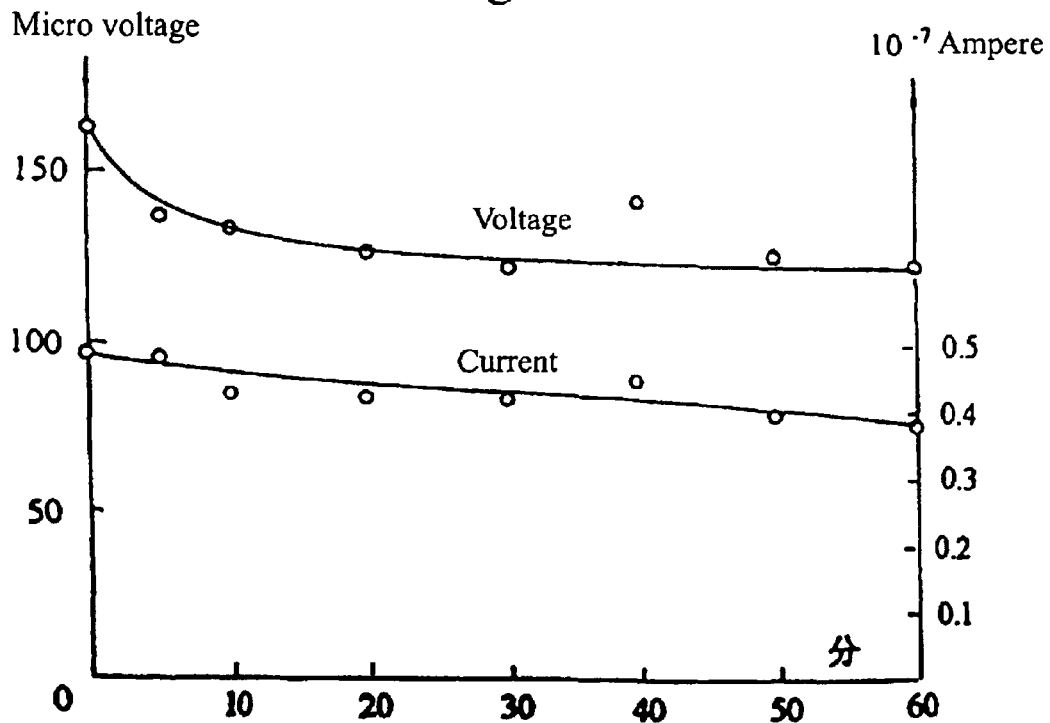
Fig.8

PARALLEL PLATE DIODE

FIELD OF INVENTION

The present invention relates to a semiconductor device, particularly to a parallel plate diode.

DESCRIPTION OF BACKGROUND ART

The conventional semiconductor diodes has an p-n junction structure made of semiconductor materials in which the carriers make orientated movements when extra electric field force is applied and they exhibit unidirectional conductivity. Such semiconductor diodes are mainly used as rectifying or switching device. Evidently, when no bias voltage or bias current is applied, the unidirectional conductivity of such diodes will disappear and become ordinary linear devices. There is another semiconductor device called selenium pile, made of several plate-like semiconductor materials, e.g., selenium rectifying plates, in series connection. It is a rectifying device that exhibits unidirectional conductivity only when extra electric field exists.

SUMMARY OF THE INVENTION

An object of the present invention is to provide a parallel plate diode that can maintain unidirectional conductivity in the circuit with no application of bias voltage or bias current.

In order to accomplish the object mentioned above, a parallel plate diode comprising metal electrodes and semiconductor materials contacting metal electrodes, wherein the two thin plate electrodes made of metal are disposed in parallel, and a layer of thin plate semiconductor material sandwiched between the two thin plate electrodes. The concentration of the carriers in the semiconductor material layer is 20% or less than that of the electrons in the metal. One of the metal electrodes is made so as to have a plurality of recesses from its surface into the interior on the side that faces the semiconductor coat layer. The diameter of those recesses is less than 4 micrometers.

Preferably, said recesses are well-shape cavities.

The parallel plate diode according to the present invention can be used as the detecting diode, which can improve the performance of the radiodetector. Furthermore, it can also be used as an electronic watch, a micro calculator as well as the power of other small power electric appliances.

BRIEF DESCRIPTION OF THE DRAWINGS

The invention will be better understood by referring to the following description in conjunction with the figures, in which:

FIGS. 6(a) and (b) are diagrams showing the structure of the parallel plate diode according to preferred embodiment of the present invention, in which FIG. 6(a) shows the section structure and 6(b) is a top view of the invention.

FIGS. 7(a) and (b) is a microscopic view of the structure of the diode according to the preferred embodiment of the present invention, in which FIG. 7(a) is a sectional view and FIG. 7(b) is a top view of the diode.

FIG. 8 is a testing curve of the experiment of the embodiment shown in FIGS. 6(a) and (b).

FIGS. 9(a) and (b) show the structure of the parallel plate diode according to another embodiment of the present invention, in which FIG. 9(a) is a front view and FIG. 9(b) a top view.

DESCRIPTION OF PREFERRED EMBODIMENTS

Figure 1:
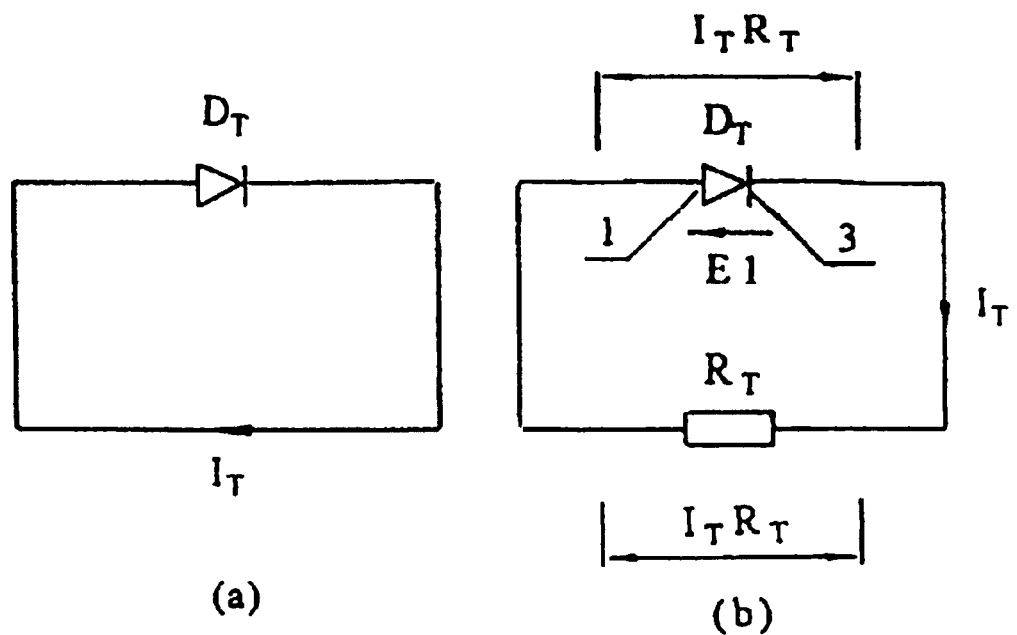
FIGS. 1(a) and (b) show the unidirectional conductivity of the parallel plate diode with no bias voltage or bias current according to the present invention.
Figure 2:
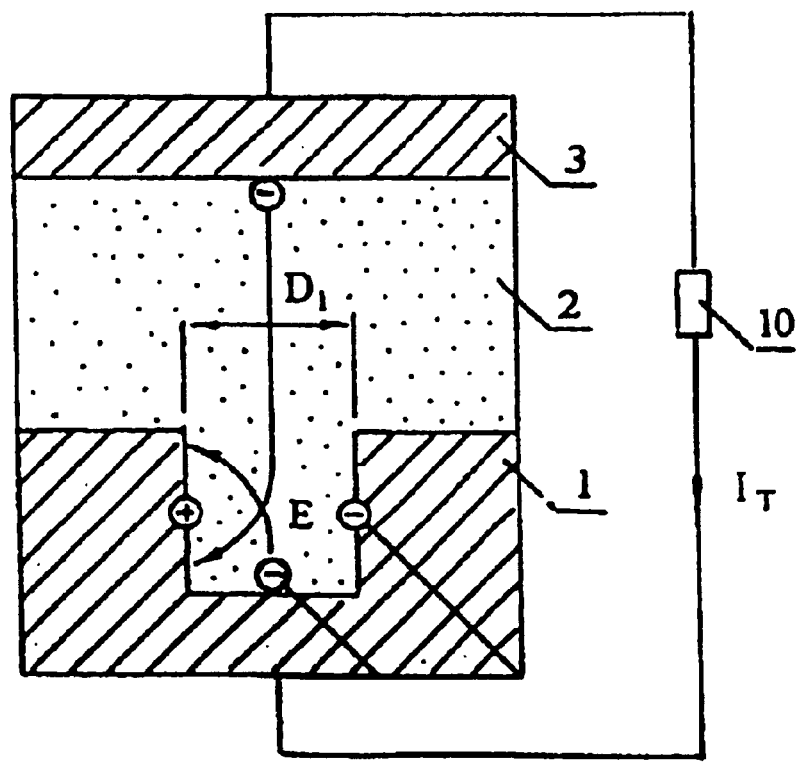
FIG. 2 is a sectional view of the structure of the "electric well" formed in the parallel plate diode according to the present invention.

As shown in FIGS. 1(a) and (b), when the parallel plate diode in the present invention are connected in closed loop circuit, there will be a continuous and constant direct current $I_T$ flowing through the loop circuit. As shown in FIG. 2, when the recesses in the interior of the metal, such as the diameter of the well-shape cavity is small enough (less than 4 micrometers), the electrostatic attraction between the dissociated electrons bound by the metal crystal lattice on the surface of the well-shape cavity and their corresponding positive ions will be evidently displayed. Under the electrostatic pull, said positive ions and the electrons tend to be attached to the surface of the well-shape cavity, thus forming the internal electric filed E in the well. Then the conducting electrons on the surface of the other thin metal plate electrode in the above mentioned diode and on the bottom of the well will be gathered on the wall of the well under the warping force of the electric field E. The well cavity exhibits the effect of "more in, less out", thus forming an "electrons well". The parallel plate diode having said structure has non-bias unidirectional conductivity, namely, it can exhibit unidirectional electric current with no application of bias voltage and bias current because of the heat movement of the conducting electrons.

The distribution of the heat movement of the conducting electrons in the metal electrodes of the parallel plate diodes approximately satisfies the Maxwell equation distribution. Due to this, experiments show that the output voltage of the parallel plate diodes varies in a considerable range with the value of load, with a maximum of several hundred milli-volts. Experiments also show that when the output voltage is approximately 30 milli-volts, the corresponding output power is relatively big and this corresponds to the mean speed of the heat movement of the conducting electrons.

The output current of the parallel plate diode in the present invention relate to the diameter of the well-shape cavity and the number of cavities in the electrodes. Specifically, when the diameter of the well cavity decreases, the unidirectional coefficient K of the diode increases and maintains the magnification of the electric current in the circuit. Furthermore, the more the well-shape cavities, the greater current the circuit will able to be maintain. It is feasible that the diameter of the well-shape cavity is approximately equal to the depth of the cavity. The applicant of the present invention has tried to study the relation between the diameter of the well cavity and the density of said electric current $I_T$ from a purely theoretical approach, by pure experimentation as well as by experimentation with theory respectively and has achieved an approximate result. The result used in the description of the present invention is derived from experimentation with theory. For example, taking in consideration the silicon parallel plate diode having the above mentioned structure, when the output voltage is 30 milli-volts, according to analysis from experimentation the density $I_T$ (ampere/cm2) of the output current has the following relation with the diameter D1 of the well-shape cavity:

$$I_T = K_3 \left(\frac{K_4}{D_1}\right)^{K_5} = 800\left(\frac{0.8 \times 10^{-6}}{D_1}\right)^{4.9} \quad (1)$$

where the unit of the diameter of the well cavity is centimeter and K3, K4, and K5 are all experimental coefficients. According to equation (1), the smaller the diameter of the well cavity, the more density the electric current. A diameter of 0.7 micrometer of the well cavity can be achieved in present invention. The output current of the parallel plate diode of present invention is 0.2 microampere. When the diameter of the well cavity is made 80 Å by using the electron beam etching method, which will be discussed later, the present diode can maintain an output electric current whose density is as much as 800 amperes/cm2, which has a promising prospect in application.

FIGS. 6(a), (b) and 7(a), (b) show parallel plate diodes made on the glass substrate 31, which is a 25 by 25 millimeters square glass plate with a thickness of 1.2 millimeter. The glass substrate has a chromium electrode 3 plated on it, and electrode 1 is made of antimony. The silicon layer 2 shown in the drawing is sandwiched between the above-mentioned chromium electrode 3 and the antimony electrode 1.

The different layers of the present embodiment can be made through coating by evaporation, in particular, the well-shape cavity can be formed through coating by evaporation or by electron beam etching. By coating of evaporation, the vacuum degree of the electrodes 1 and 3 being evaporated is $5*10^{-3}$Pa, and the vacuum degree of the silicon layer 2 being evaporated is 1.5–1.8Pa in the nitrogen environment. At this time, the diameter of the well-shape cavity formed is 0.7 micrometer with a depth of approximately 0.2 micrometer. The resulting chromium electrode 3 under such a condition is a smooth electrode as the positive pole of the diode, while the antimony electrode 1 is an electrode having a well-shape cavity as the negative pole of the diode.

In order to achieve a well-shape cavity with a diameter of 200 Å and a depth of 200 Å, a chromium layer 3 should first be coated by evaporation using the method of electron beam etching, then a cavity is carved on the chromium layer. The silicon layer 2 is formed by chemical vapor deposition. The antimony layer 1 is also formed through coating by evaporation. The vacuum degree of the chromium 3 and the antimony 1 should be maintained at $5*10^{-3}$Pa when being coated by evaporation.

FIG. 8 is the testing curve of the parallel plate diode of the present embodiment made by the method of coating by evaporation. When the diode of the present embodiment is connected in the circuit, as shown in FIG. 1(b), whose load is 3 mega ohms, at this time, the metal electrode that has the well-shape cavity is the negative pole and the other plate metal electrode is the positive pole. FIG. 8 shows simultaneously the output current and voltage achieved through such a method, in which the abscissa is the measuring time (the unit is minute) and the ordinate indicates the output voltage and current of the diode using the units of milli-volt and ampere respectively. It can be seen from the FIG. 8 that the parallel plate diode of the embodiment of the present invention can obtain a stable output of voltage and current and a good performance of unidirectional conductivity.

Figure 3:
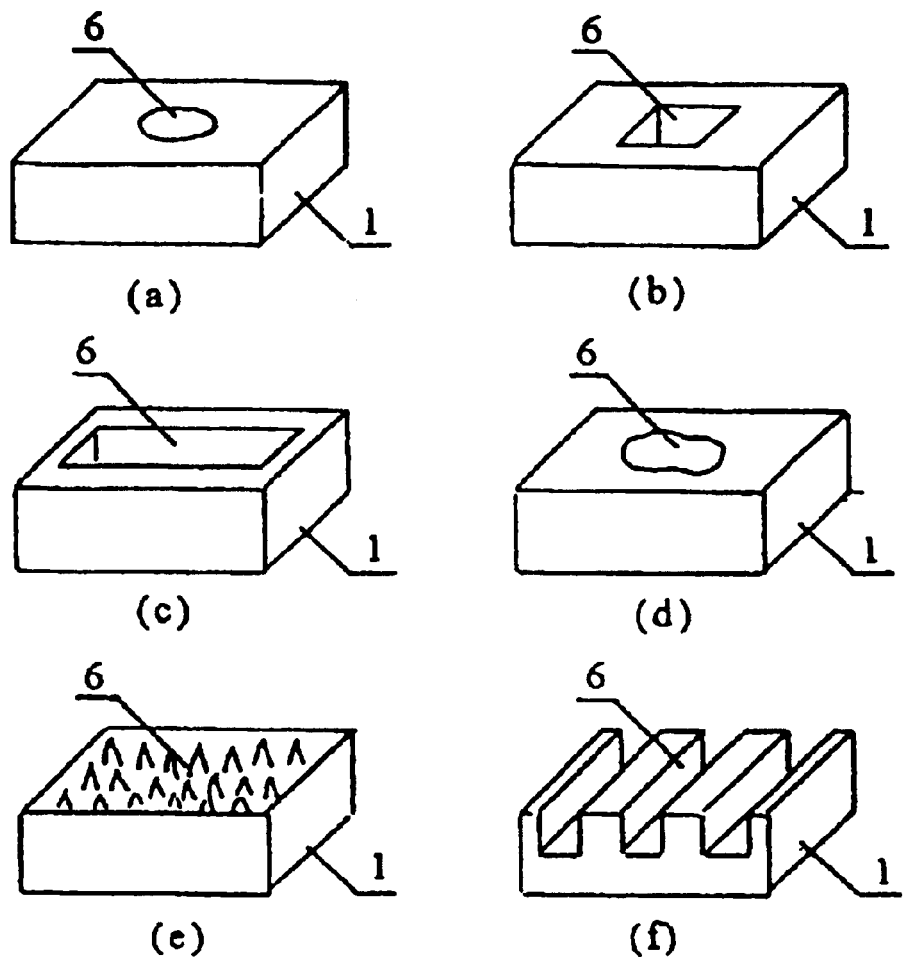
FIGS. 3(a)–(f) is a sectional of the recesses within the parallel plate diode of the present invention.

The cross section of the diode of the embodiment of the present invention can be a circular, a square, rectangle or an irregular curve. As shown in FIGS. 3(a)–(c), it can also be in a slot and these recesses fill the electrodes.

Said well cavity can also be in the form of an array of projections in which convex portions and concave portions are staggered with respect to each other, as shown in FIG. 3(e).

Figure 6:
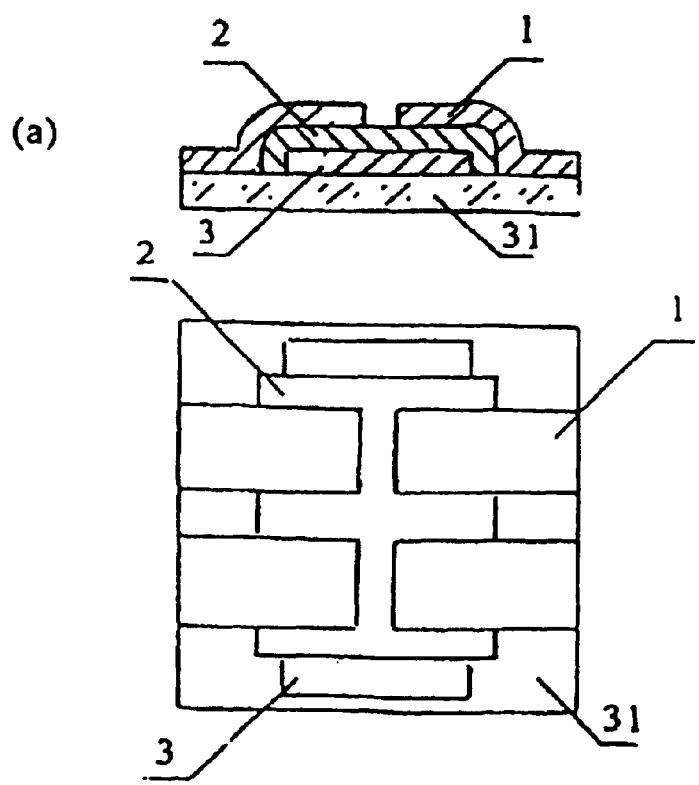

The silicon material used in the embodiment of the present invention can be n-type or p-type silicon, including high-resistance type, medium-resistance type, low-resistance type, mixed type or essential type silicon. And various kinds of germanium material or any kind of semiconductor material can be used to make the diode of the embodiment in the present invention. The metal electrode can be any homogeneous metal or alloy as long as it can fix the three layers of materials labeled 1, 2, and 3 as shown in FIG. 6 tightly together. Parallel plate diode made of these materials in the embodiment of the present invention can also achieve electric current and voltage output.

Furthermore, according the results of the abovementioned experiments, it is not difficult to understand for the person skilled in the art that liquid semiconductor materials, high resistance metal alloy can both serve as very efficient materials for the parallel plate diode, in which high-resistance alloy belongs to metal, whose intensity is much higher than semiconductors. When liquid semiconductor materials or high resistance metal alloy are used to make parallel plate diode, it can be very firm. As for the liquid materials, because of their mobility, the advantage of using them in making diodes lies in that once the diodes are damaged, it can be automatically repaired and that components made of such liquid materials are not subject to damage because of the difference in the expansion coefficients. Furthermore, liquid materials also have the advantage of good performance in heat exchange.

With the parallel plate diode having the abovementioned structure as a unit on the substrate of the same glass or other insulators, the metal electrode having the well-shape cavity of each diode is coupled to the germanium electrode of the adjoining diode having the same structure, thus forming a parallel plate diode in series structure.

Only the diodes should be kept parallel to each other, and there is no restriction on the overall shape formed by said different layers. That is to say, the parallel plate in the present invention should not be restricted to the pure notion of a "parallel plate" of the "flat plate" type. In fact, FIGS. 5(a)–(d) is parallel plate structure.

It is noted that it is very difficult to achieve an electrode with an ideally smooth surface. In practice, there are recesses on the surface where the two metal electrodes that make up the parallel plate diode of the embodiment of the present invention contact the semiconductor material. The average diameter of the recesses on one side is equal to or smaller than 0.7 micrometer while the average diameter of the recesses on the other side is bigger than 0.7 micrometer. When such diode is connected in the closed circuit, the metal electrode whose recesses have smaller diameters is the negative pole, whereas the metal electrode whose recesses have bigger diameters is the positive pole. In general, the special contacting surface between the two electrodes and the semiconductor is filled with recesses with different depths and shapes. Such diodes can also output currents and volt.

Figure 4:
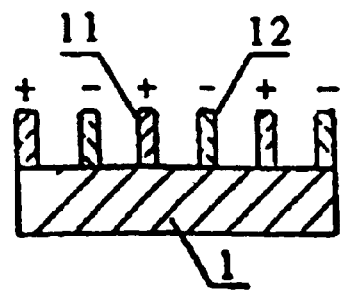
FIG. 4 is a sectional view of the structure of the well cavity of the well wall made of different material in the parallel plate diode of the present invention.
Figure 5:
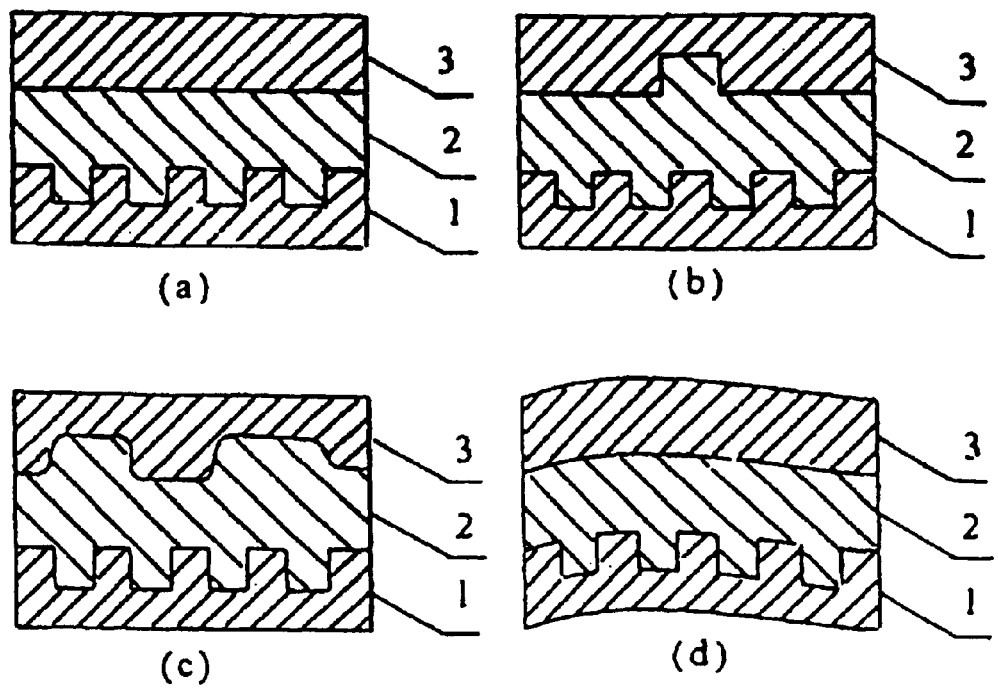
FIGS. 5(a)–(d) are section views of the parallel plate diode of the present invention, in which 5(b) and (c) show that there are well-shape cavities within both of the metal electrodes of the diode.

The two walls of the well-shape cavity of the parallel plate diode of the present invention can be made of two substances, as shown in FIG. 4. If we use e$\Phi$1 and e$\Phi$3 respectively to represent the power function of the two walls of the well cavity, therefore, when they satisfy the following relation:

$$\Phi_1 < \Phi_3$$

The parallel plate diode on the well cavity of the well walls made of different substances will have good unidirectional coefficients. In particular, when such wall structure of the well cavity containing different materials is applied to the groove-shaped structure in FIG. 3(f), that is, both the right and the left sides of the groove are made of two kinds of materials and their power function meet the abovementioned relation, then a parallel plate diode having bigger output current and higher voltage and high unidirectional coefficient can be achieved. Besides, the groove-shaped structure in FIG. 3(f) is easy for processing.

Figure 9:
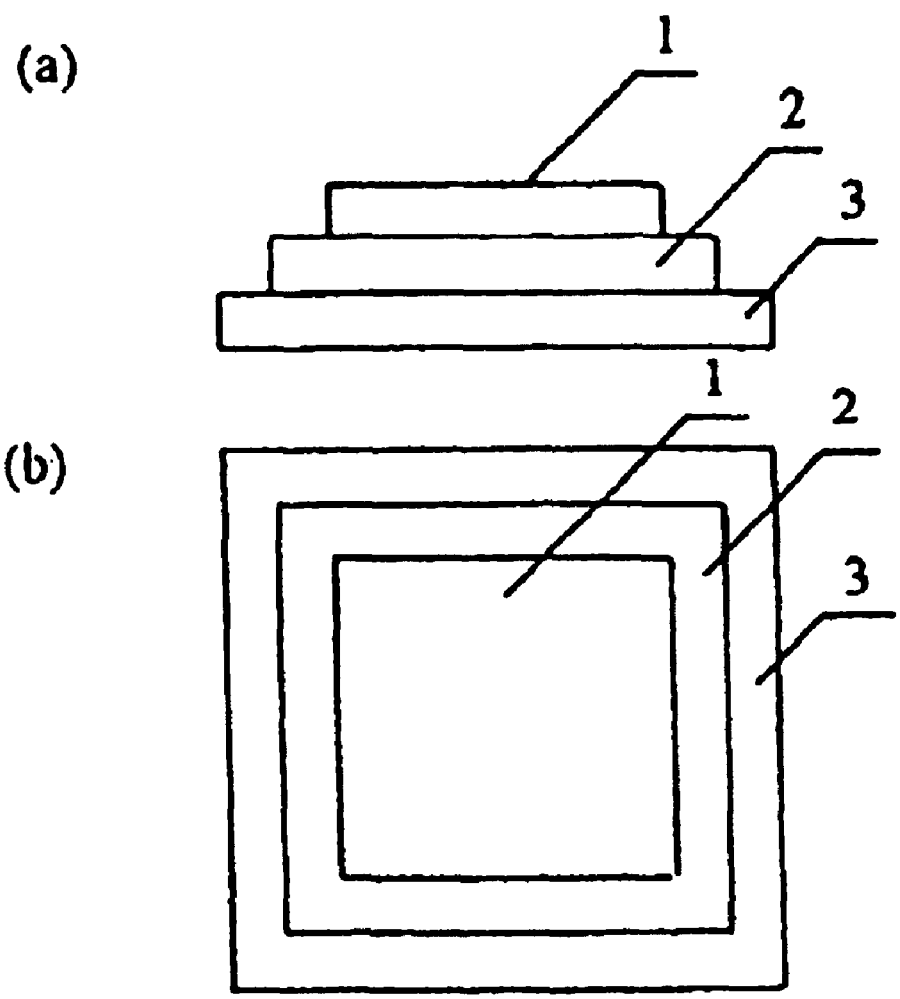

FIGS. 9(a), (b) and 10 show another embodiment of the parallel plate diode according to the present invention, which uses Kovar® alloy as the substrate.

As shown in FIGS. 9(a) and (b), Kovar® alloy whose heat expansion coefficient is about $3.1 \times 10^{-6}$ is chosen to make a 20×20 millimeter metal substrate 3 whose thickness is 0.2 millimeter. There is a silicon layer 2 on the metal substrate with a total thickness of 2 micrometers and said silicon layer 2 forms continuous projections with the side opposite to the surface of the metal plate to which the said silicon layer 2 is attached (see FIG. 10) and the surface of such continuous projections contact the Kovar® alloy electrode 1 made of another layer of Kovar® alloy, thus the continuous projecting surface of said silicon layer causes the latter Kovar® alloy electrode 1 to form well-shape cavities.

Figure 10:
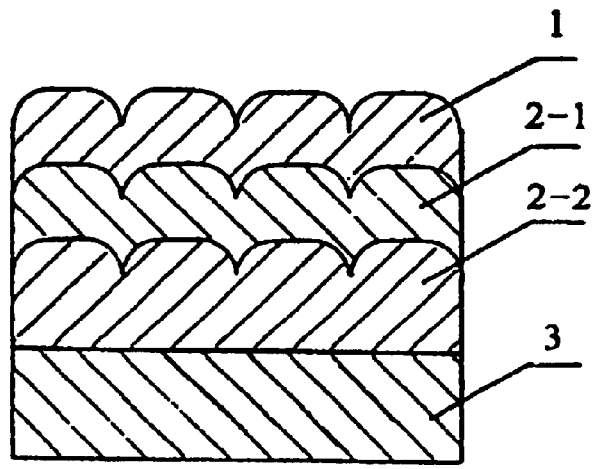
FIG. 10 is a microscopic view of the structure of the embodiment shown in FIGS. 9(a) and (b).

In FIG. 10, label 2-2 indicates the first silicon layer plated by the lower vacuum layer 16 formed through coating by evaporation (in a nitrogen environment, the air pressure sure is maintained between 1.5–1.8Pa), whereas label 2-1 indicates the second silicon on layer formed by higher vacuum (about $5 \times 10^{-3}$Pa) silicon filming, including 6 layers of silicon films to enhance the intensity of the plated films.

Figure 11:
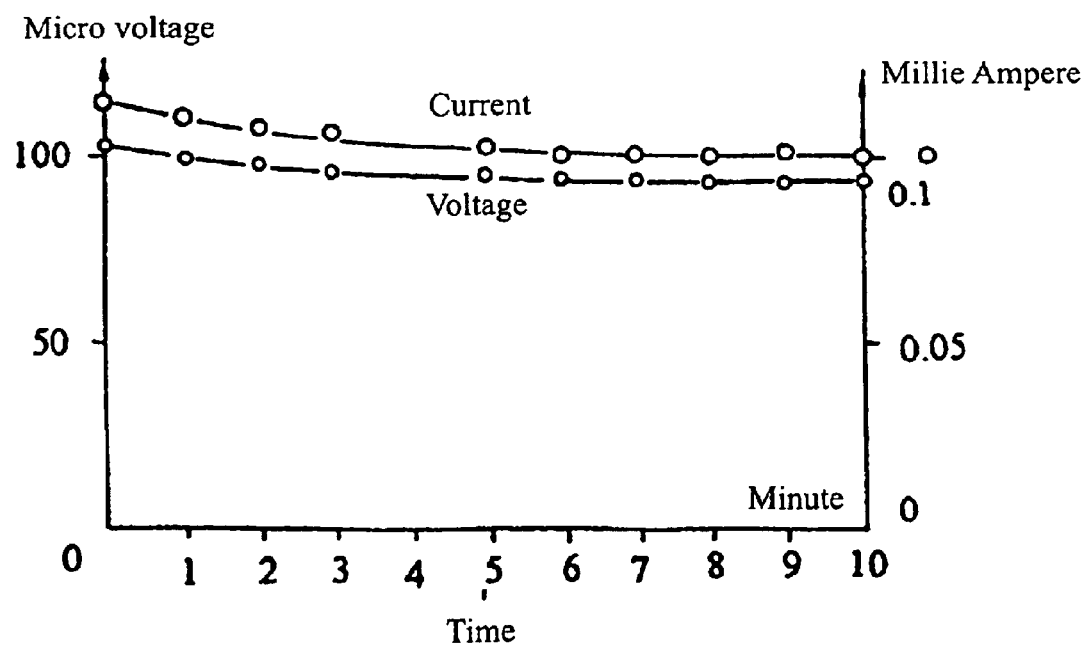
FIG. 11 is a testing curve of the experiment of the embodiment shown in FIGS. 9(a) and (b).

FIG. 11 shows the testing curves of the diode in the embodiment of the present invention. When the diode of the present embodiment is connected in the circuit, as shown in FIG. 1 (b), whose load is 3 mega ohms, at this time, the metal electrode that has the well-shape cavity is the negative pole and the other thin plate metal electrode is the positive pole. FIG. 11 shows simultaneously the output current and voltage achieved through such a method, in which the abscissa is the measuring time (the unit is minute) and the ordinate indicates the output voltage and current of the diode using the units of milli-volt and ampere respectively. It can be seen that the use of the parallel plate diode of the embodiment of the present invention can assure a stable output of voltage and current and a good performance of unidirectional conductivity.

The parallel plate diode having the abovementioned structure can be taken as a unit, each of the kovar-alloy electrodes having well-shape cavities of such diodes can join the kovar-alloy substrate of the other diode having identical structure so that they form a parallel plate diode in series.

What is claimed is:

1. A parallel plate diode, comprising:
   two thin plate metal electrodes and a semiconductor material layer contacting said metal electrodes, wherein the two thin plate metal electrodes are disposed in parallel, wherein the semiconductor material layer is sandwiched between the two thin plate electrodes, wherein the concentration of the carriers in the semiconductor material layer is 20% or less than that of the electrons in the metal, one of the metal electrodes is made so as to have a plurality of recesses from its surface into the interior on the side that faces the semiconductor material layer, wherein the diameter of those recesses is less than 4 micrometers,
   wherein said recesses are well-shape cavities,
   wherein a cross section of the well-shape cavity is in the form of an array of convex portions and concave portions.

2. The parallel plate diode according to claim 1, wherein said parallel plate diode is attached to an insulated substrate.

3. The parallel plate diode according to claim 2, wherein said parallel plate diode is attached to a glass substrate.

4. The parallel plate diode according to claim 3, wherein the metal electrode having the well-shape cavity of the diode is coupled to a germanium electrode of an adjoining diode having the same structure, thus forming a parallel plate diode in series structure.

5. The parallel plate diode according to claim 1, wherein said cross section of the well-shape cavity is a circular, a square, rectangle or an irregular curve.

6. The parallel plate diode according to claim 1, wherein said cross section of the well-shape cavity is groove-shape.

7. A parallel plate diode, comprising:
   two thin plate metal electrodes and a semiconductor material layer contacting said metal electrodes, wherein the two thin plate metal electrodes are disposed in parallel, wherein the semiconductor material layer is sandwiched between the two thin plate electrodes, wherein the concentration of the carriers in the semiconductor material layer is 20% or less than that of the electrons in the metal, one of the metal electrodes is made so as to have a plurality of recesses from its surface into the interior on the side that faces the semiconductor material layer, wherein the diameter of those recesses is less than 4 micrometers,
   wherein said each of the metal electrodes has one or more well-shape cavities, the well-shape cavities of the two electrodes having identical structures so that they can be joined together to form a parallel plate diode in series.

8. A parallel plate diode, comprising:
   two thin plate metal electrodes and a semiconductor material layer contacting said metal electrodes, wherein the two thin plate metal electrodes are disposed in parallel, wherein the semiconductor material layer is sandwiched between the two thin plate electrodes, wherein the concentration of the carriers in the semiconductor material layer is 20% or less than that of the electrons in the metal, one of the metal electrodes is made so as to have a plurality of recesses from its surface into the interior on the side that faces the semiconductor material layer, wherein the diameter of those recesses is less than 4 micrometers,
   wherein there are recesses on the surfaces wherein the two metal electrodes that make up the parallel plate diode contact the semiconductor material, and wherein the average diameter of the recesses on one side of the semiconductor material is equal to or smaller than 0.7 micrometer while the average diameter of the recesses on the other side is bigger than 0.7 micrometer.

9. The parallel plate diode according to claim 8, wherein the surface of the two electrodes have recesses with different depths.

10. The parallel plate diode according to claim 8, wherein said the surface of the two electrodes have recesses with different shape.

11. The parallel plate diode according to claim 1, 7 or 8, wherein one or more of said metal electrodes is made from an alloy of iron, nickel and cobalt having a thermal expansion coefficient of about $3 \times 10^{-6}$.

* * * * *